US012298845B2

(12) United States Patent
Bhatia

(10) Patent No.: US 12,298,845 B2
(45) Date of Patent: May 13, 2025

(54) TECHNIQUES FOR DATA SCRAMBLING ON A MEMORY INTERFACE

(71) Applicant: NVIDIA CORPORATION, Santa Clara, CA (US)

(72) Inventor: Gautam Bhatia, Mountain View, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 142 days.

(21) Appl. No.: 18/070,006

(22) Filed: Nov. 28, 2022

(65) Prior Publication Data

US 2023/0195561 A1 Jun. 22, 2023

Related U.S. Application Data

(60) Provisional application No. 63/291,801, filed on Dec. 20, 2021.

(51) Int. Cl.
*G06F 11/10* (2006.01)
*G06F 11/07* (2006.01)

(52) U.S. Cl.
CPC ...... *G06F 11/1004* (2013.01); *G06F 11/0772* (2013.01); *G06F 11/1068* (2013.01)

(58) Field of Classification Search
None
See application file for complete search history.

(56) References Cited

U.S. PATENT DOCUMENTS

| 7,929,549 | B1* | 4/2011 | Talbot ............ H04L 9/0662 370/440 |
| 8,402,349 | B2* | 3/2013 | Lee ............... G06F 12/1408 714/773 |
| 2005/0160344 | A1 | 7/2005 | Park et al. | |

(Continued)

FOREIGN PATENT DOCUMENTS

WO 2016/105783 A1 6/2016

OTHER PUBLICATIONS

International Search Report for Application No. PCT/US2022/081379 dated Mar. 24, 2023.

*Primary Examiner* — Mark D Featherstone
*Assistant Examiner* — Matthew W Wahlin
(74) *Attorney, Agent, or Firm* — Squire Patton Boggs LLP; Sarah Mirza

(57) ABSTRACT

Various embodiments include a memory device that recovers from write errors and read errors more quickly relative to prior memory devices. Certain patterns of write data and read data may result on poor signal quality on the memory interface between memory controllers and memory devices. The disclosed memory device, synchronously with the memory controller, scrambles read data before transmitting the data to the memory controller and descrambles received from the memory controller. The scrambling and descrambling results in a different pattern on the memory interface even for the same read data or write data. Therefore, when a write operation or a read operation fails, and the operation is replayed, the pattern transmitted on the memory interface is different when the operation is replayed. As a result, the memory device more easily recovers from data patterns that cause poor signal quality on the memory interface.

22 Claims, 6 Drawing Sheets

(56) References Cited

U.S. PATENT DOCUMENTS

| | | | |
|---|---|---|---|
| 2008/0040569 A1* | 2/2008 | Ferraiolo | G06F 13/4239 |
| | | | 711/170 |
| 2014/0237205 A1* | 8/2014 | Takefman | G06F 3/0659 |
| | | | 711/162 |
| 2015/0205730 A1 | 7/2015 | Dell et al. | |
| 2016/0188523 A1* | 6/2016 | Teoh | G06F 13/1668 |
| | | | 710/105 |
| 2019/0229749 A1 | 7/2019 | Sudhakaran et al. | |
| 2020/0285538 A1* | 9/2020 | Kim | H03M 13/353 |
| 2021/0382638 A1* | 12/2021 | Anderson | G06F 3/0632 |

* cited by examiner

TECHNIQUES FOR DATA SCRAMBLING ON A MEMORY INTERFACE

CROSS-REFERENCE TO RELATED APPLICATIONS

This application claims priority benefit of the U.S. Provisional Patent Application titled, "DATA SCRAMBLING ON A MEMORY INTERFACE," filed on Dec. 20, 2021 and having Ser. No. 63/291,801. The subject matter of this related application is hereby incorporated herein by reference.

BACKGROUND

Field of the Various Embodiments

Various embodiments relate generally to computer memory devices and, more specifically, to techniques for data scrambling on a memory interface.

Description of the Related Art

A computer system generally includes, among other things, one or more processing units, such as central processing units (CPUs) and/or graphics processing units (GPUs), and one or more memory systems. One type of memory system is referred to as system memory, which is accessible to both the CPU(s) and the GPU(s). Another type of memory system is graphics memory, which is typically accessible only by the GPU(s). These memory systems comprise multiple memory devices. One example memory device employed in system memory and/or graphics memory is synchronous dynamic-random access memory (SDRAM or, more succinctly, DRAM).

Conventionally, a high-speed DRAM memory device employs multiple interfaces. The interfaces include a command address interface for transferring commands and/or memory addresses to the DRAM. Such commands include a command to initiate a write operation, a command to initiate a read operation, and/or the like. The interfaces further include a data interface for transferring data to and from the DRAM, such as during write operations and read operations. One or more memory controllers provide an interface to perform write operations, read operations, and other DRAM commands on behalf of memory clients executing on the CPUs and/or the GPUs.

As the speed of DRAM memory devices increases, write operations and read operations become increasingly sensitive to phenomena that can affect the quality of the signals transmitted to and received from the DRAM. For example, poor signal quality increases the likelihood that the data written to and/or read from the DRAM has one or more bit errors. One technique for detecting and/or correcting such errors is to generate a separate cyclic redundancy check (CRC) code based on the data at the signal source and to check the CRC code against the data at the signal destination. Upon detecting a CRC error, the memory controller initiates a replay operation where the erroneous data is again written to the memory or read from the memory. Because signal quality typically varies over time, the replay operation may be successful even through the original operation resulted in an error.

One disadvantage of this technique for resolving bit errors during DRAM write operations and read operations is that certain errors are not easily resolved by replay operations. One particular source of error on high-speed DRAM interfaces is data-dependent jitter. Data dependent jitter may result from inter symbol interference, where one symbol, or set of data, transmitted on an interface interferes with subsequent symbols transmitted on the same interface. Data dependent jitter may further result from crosstalk, where data transmitted on one signal path of an interface interferes with data transmitted on other nearby signal paths of the interface. Because these types of interference are data dependent, the errors caused by data dependent jitter may recur during subsequent replay operations. For some pathological data patterns, the memory controller may initiate a series of unsuccessful replay operations due to repeated errors associated with the data pattern. Such repeated errors may result in reduced DRAM performance, increased latency of write operations and/or read operations, or, under extreme circumstances, system failure.

As the foregoing illustrates, what is needed in the art are more effective techniques for recovering from errors associated with memory devices.

SUMMARY

Various embodiments of the present disclosure set forth a computer-implemented method for processing scrambled data in a memory device. The method includes synchronizing a first set of data scrambling operations associated with the memory device with a second set of data scrambling operations associated with a memory controller. The method further includes receiving first scrambled data based on a first value generated by the second set of data scrambling operations. The method further includes descrambling the first scrambled data based on a second value generated by the first set of data scrambling operations to generate descrambled data. The method further includes storing the descrambled data in a memory core of the memory device.

Other embodiments include, without limitation, a system that implements one or more aspects of the disclosed techniques, and one or more computer readable media including instructions for performing one or more aspects of the disclosed techniques, as well as a method for performing one or more aspects of the disclosed techniques.

At least one technical advantage of the disclosed techniques relative to the prior art is that, with the disclosed techniques, the DRAM memory device, in concert with the memory controller, changes the scrambling pattern for the write data or read data during replay operations. As a result, the scrambled data transferred over the memory interface changes between the original operation and the associated replay operation. Similarly, the scrambled data transferred over the memory interface changes between a first replay operation and a subsequent second replay operation for the same original operation. Consequently, the likelihood that an error resulting from data dependent jitter for one operation will be repeated during a subsequent replay operation is reduced relative to prior techniques. These advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
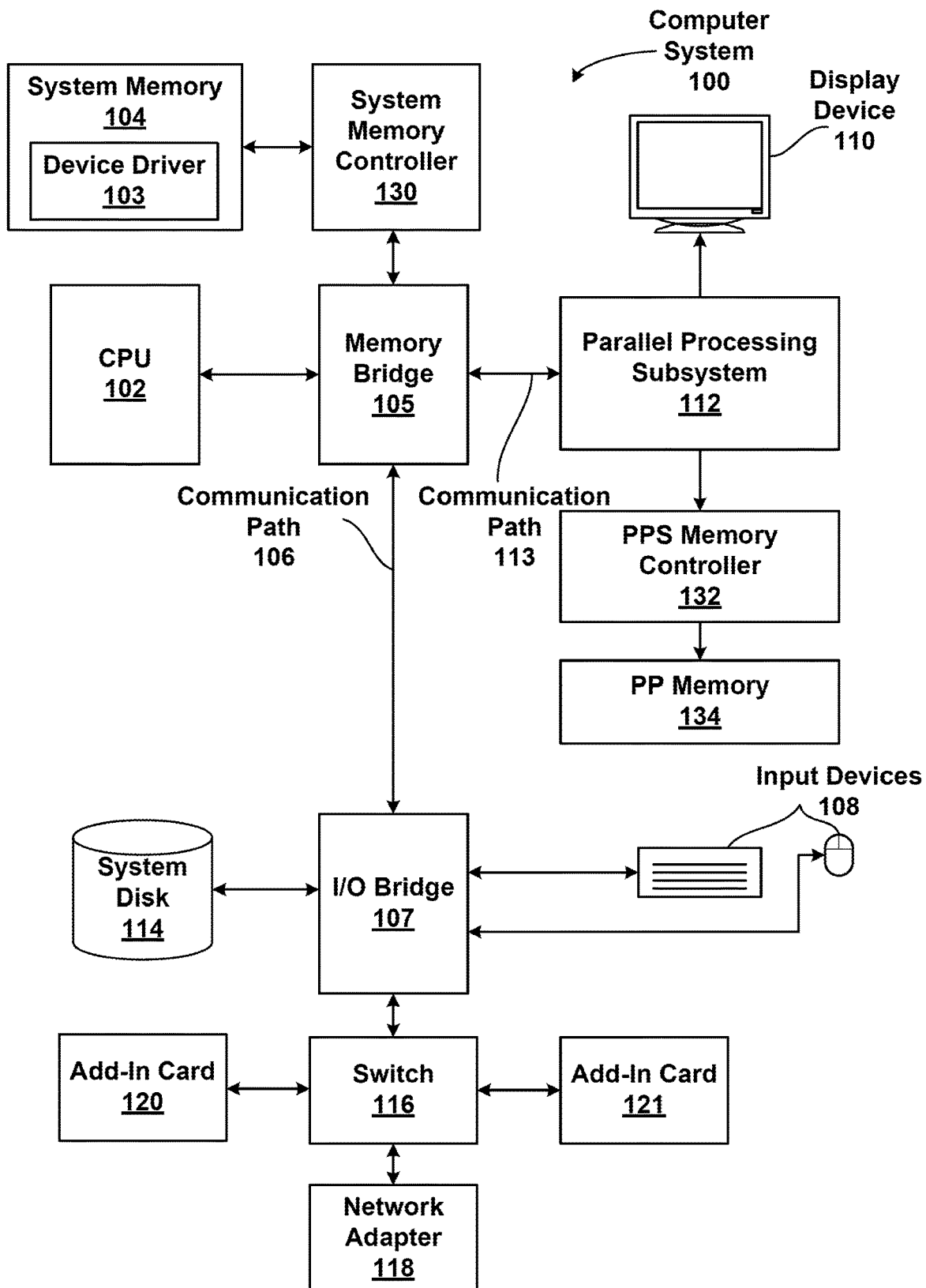
FIG. 1 is a block diagram of a computer system configured to implement one or more aspects of the various embodiments.

FIG. 1 is a block diagram of a computer system 100 configured to implement one or more aspects of the various embodiments. As shown, computer system 100 includes, without limitation, a central processing unit (CPU) 102 and a system memory 104 coupled to a parallel processing subsystem 112 via a memory bridge 105 and a communication path 113. Memory bridge 105 is coupled to system memory 104 via a system memory controller 130. Memory bridge 105 is further coupled to an I/O (input/output) bridge 107 via a communication path 106, and I/O bridge 107 is, in turn, coupled to a switch 116. Parallel processing subsystem 112 is coupled to parallel processing memory 134 via a parallel processing subsystem (PPS) memory controller 132.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high-definition DVD), or other magnetic, optical, or solid-state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, and/or the like. In such embodiments, parallel processing subsystem 112 incorporates circuitry optimized for graphics and video processing, including, for example, video output circuitry. Such circuitry may be incorporated across one or more parallel processing units (PPUs) included within parallel processing subsystem 112. In some embodiments, each PUPS comprises a graphics processing unit (GPU) that may be configured to implement a graphics rendering pipeline to perform various operations related to generating pixel data based on graphics data supplied by CPU 102 and/or system memory 104. Each PPU may be implemented using one or more integrated circuit devices, such as programmable processors, application specific integrated circuits (ASICs), or memory devices, or in any other technically feasible fashion In some embodiments, parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more other elements of FIG. 1 to form a single system. For example, parallel processing subsystem 112 may be integrated with CPU 102 and other connection circuitry on a single chip to form a system on chip (SoC).

In operation, CPU 102 is the master processor of computer system 100, controlling and coordinating operations of other system components. In particular, CPU 102 issues commands that control the operation of PPUs within parallel processing subsystem 112. In some embodiments, CPU 102 writes a stream of commands for PPUs within parallel processing subsystem 112 to a data structure (not explicitly shown in FIG. 1) that may be located in system memory 104, PP memory 134, or another storage location accessible to both CPU 102 and PPUs. A pointer to the data structure is written to a pushbuffer to initiate processing of the stream of commands in the data structure. The PPU reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

Each PPU includes an I/O (input/output) unit that communicates with the rest of computer system 100 via the communication path 113 and memory bridge 105. This I/O unit generates packets (or other signals) for transmission on communication path 113 and also receives all incoming packets (or other signals) from communication path 113, directing the incoming packets to appropriate components of the PPU. The connection of PPUs to the rest of computer system 100 may be varied. In some embodiments, parallel processing subsystem 112, which includes at least one PPU, is implemented as an add-in card that can be inserted into an expansion slot of computer system 100. In other embodiments, the PPUs can be integrated on a single chip with a bus bridge, such as memory bridge 105 or I/O bridge 107. Again, in still other embodiments, some or all of the elements of the PPUs may be included along with CPU 102 in a single integrated circuit or system of chip (SoC).

CPU 102 and PPUs within parallel processing subsystem 112 access system memory via a system memory controller 130. System memory controller 130 transmits signals to the memory devices included in system memory 104 to initiate the memory devices, transmit commands to the memory devices, write data to the memory devices, read data from the memory devices, and/or the like. One example memory device employed in system memory 104 is double-data rate SDRAM (DDR SDRAM or, more succinctly, DDR). DDR memory devices perform memory write and read operations at twice the data rate of previous generation single data rate (SDR) memory devices.

In addition, PPUs and/or other components within parallel processing subsystem 112 access PP memory 134 via a parallel processing system (PPS) memory controller 132. PPS memory controller 132 transmits signals to the memory devices included in PP memory 134 to initiate the memory devices, transmit commands to the memory devices, write data to the memory devices, read data from the memory devices, and/or the like. One example memory device employed in PP memory 134 synchronous graphics random access memory (SCRAM), which is a specialized form of SDRAM for computer graphics applications. One particular type of SCRAM is graphics double-data rate SCRAM (GDDR SDRAM or, more succinctly, GDDR). Compared with DDR memory devices, GDDR memory devices are configured with a wider data bus, in order to transfer more data bits with each memory write and read operation. By employing double data rate technology and a wider data bus, GDDR memory devices are able to achieve the high data transfer rates typically needed by PPUs.

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

It will be appreciated that the core architecture described herein is illustrative and that variations and modifications are possible. Among other things, the computer system 100 of FIG. 1, may include any number of CPUs 102, parallel processing subsystems 112, or memory systems, such as system memory 104 and parallel processing memory 134, within the scope of the disclosed embodiments. Further, as used herein, references to shared memory may include any one or more technically feasible memories, including, without limitation, a local memory shared by one or more PPUs within parallel processing subsystem 112, memory shared between multiple parallel processing subsystems 112, a cache memory, parallel processing memory 134, and/or system memory 104. Please also note, as used herein, references to cache memory may include any one or more technically feasible memories, including, without limitation, an L1 cache, an L1.5 cache, and L2 caches. In view of the foregoing, persons of ordinary skill in the art will appreciate that the architecture described in FIG. 1 in no way limits the scope of the various embodiments of the present disclosure.

Performing Data Scrambling on an Interface of a DRAM

Various embodiments are directed to techniques for data scrambling on a memory interface between a DRAM memory device and a memory controller. The disclosed techniques provide synchronized scrambling and descrambling of data on a memory interface to ensure that a pathological data pattern is not repeated on the interface. A memory controller coupled with a memory device generates a predictable series of sequence values, also referred to herein as scramble codes. The disclosed memory device stores the same predictable series of sequence values, as received from the memory controller.

During a write operation, the memory controller scrambles the write data according to a first sequence value. The memory controller further transmits the first sequence value to the memory device, and the memory device stores the first sequence value in a memory location, such as a configuration register. When the memory device receives the scrambled write data, the memory device descrambles the write data according to the same first sequence value as stored in the memory location. If the write operation fails, the memory controller repeats the write operation with the same write data. The memory controller scrambles the write data according to a second sequence value, resulting in a different pattern on the memory interface. The memory controller further transmits the first sequence value to the memory device, and the memory device stores the first sequence value in a memory location, such as a configuration register. When the memory device receives the scrambled write data, the memory device descrambles the write data according to the same second sequence value as stored in the memory location.

The memory controller transmits a third sequence value to the memory device, and the memory device stores the third sequence value in a memory location, such as a configuration register. During a read operation, the memory device scrambles the read data according to the third sequence value. When the memory controller receives the scrambled read data, the memory controller descrambles the read data according to the same third sequence value. If the read operation fails, the memory controller transmits a fourth sequence value to the memory device, and the memory device stores the fourth sequence value in a memory location, such as a configuration register. The memory controller repeats the read operation, and the memory device retrieves the same read data. The memory device scrambles the read data according to a fourth sequence value, resulting in a different pattern on the memory interface. When the memory controller receives the scrambled read data, the memory controller descrambles the read data according to the same fourth sequence value.

Figure 2:
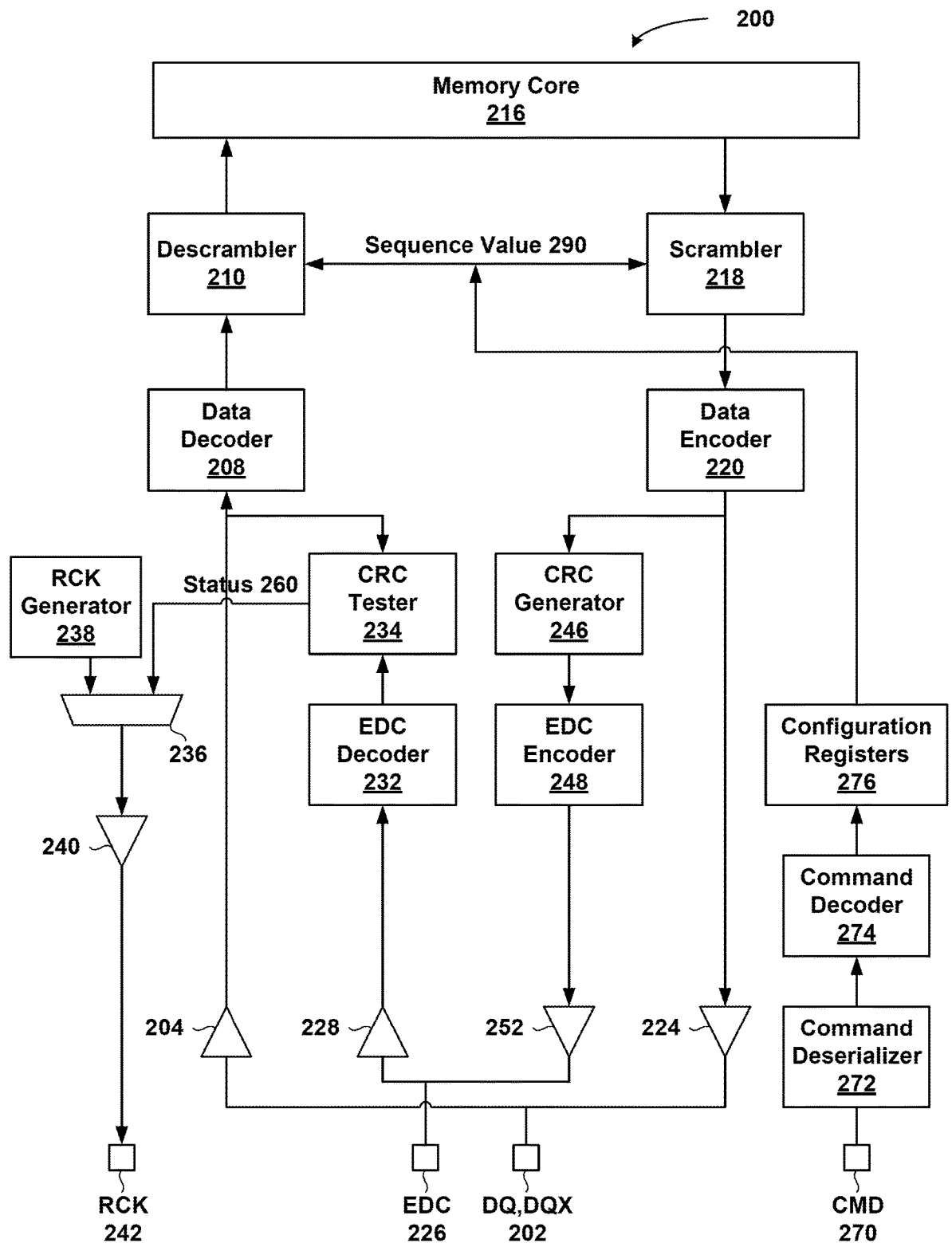
FIG. 2 is a block diagram of a data scrambling architecture for a memory device included in system memory and/or parallel processing memory of the computer system of FIG. 1, according to various embodiments.

FIG. 2 is a block diagram of a data scrambling architecture 200 for a memory device included in system memory 104 and/or parallel processing memory 134 of the computer system of FIG. 1, according to various embodiments. As further described, data scrambling architecture 200 includes components to support data descrambling during write operations and data scrambling during read operations.

In some examples, a command deserializer 272 included in the memory device receives serialized commands via command (CMD) pins 270. The serialized commands may include any number of partial command words where each partial command word includes a portion of the entire command. Each partial command may include any number of bits. For example, each command may include twenty bits that command deserializer 272 receives as four partial command words of five bits each. Command deserializer 272 deserializes the four partial command words to reconstruct the twenty-bit command. Command deserializer 272 transmits the deserialized commands to a command decoder 274.

Command decoder 274 decodes the commands received from command deserializer 272. Some commands store values to and/or load values from configuration registers 276. For example, command decoder 274 can receive a command to store a value in configuration registers 276 to enable data scrambling or to disable data scrambling. Command decoder 274 can receive a command to store a value in configuration registers 276 to enable or disable various components of data scrambling, such as a linear feedback shift register, a pseudorandom number generator, inversion logic, swap logic, shift logic, and/or the like.

Some commands perform various operations in the memory device. For example, command decoder 274 can receive a read command and, in response, the memory device performs a read operation to load data from memory core 216 and transmit the data to the memory controller. Similarly, command decoder 274 can receive a write command and, in response, the memory device performs a write operation to store data received from the memory controller in memory core 216. Further, if command decoder 274 receives a command to store one or more sequence values, such as from a memory controller, then command decoder 274 stores the received sequence value in a memory location, such as one or more of the registers included in configuration registers 276. One of more of the sequence values, such as sequence value 290, are used to descramble data during write operations and to scramble data during read operations. Subsequently, when command decoder 274 receives a read command when data scrambling is enabled, then command decoder 274 causes data associated with the read command or write command to be scrambled based on one or more of the sequence values stored in configuration registers, such as sequence value 290. Similarly, when command decoder 274 receives a write command when data scrambling is enabled, then command decoder 274 causes data associated with the read command or write command to be descrambled based on one or more of the sequence values stored in configuration registers, such as sequence value 290.

During a write operation, a memory controller, such as system memory controller 130 and/or PPS memory controller 132, scrambles the write data, optionally encodes the write data, serializes the write data, and transmits the write data to the memory device. Data scrambling architecture 200 of the memory device receives the write data via one or more data (DQ) and/or extended data (DQX) I/O pins 202. Receiver 204 receives the write data from the DQ, DQX I/O pins 202, deserializes the write data, and transmits the write data to data decoder 208.

Data decoder 208 performs a decode operation on the write data. Write data transmitted by the memory controller to the DQ, DQX I/O pins 202 is typically encoded to optimize the signal transmission over the memory interface. The goal of transmitting encoded data over the physical I/O layer between the memory controller and the DRAM is to optimize the data for signal transmission. The encoding optimizes the data to minimize transitions on the interface, to minimize crosstalk, to reduce the amount of direct current (DC) power consumed by termination circuit on the interface, and/or the like. The data may be encoded via a maximum transition avoidance (MTA) operation, which reduces the number of low-to-high and/or high-to-low signal transitions in order to improve the signal-to-noise ratio (SNR) on the memory interface. Additionally or alternatively, the data may be encoded via a data bus inversion (DBI) operation in order to reduce the number of high signal values on the memory interface in order to reduce power consumed over the memory interface. Additionally or alternatively, the data may be encoded via a pulse-amplitude modulation version 3 (PAM3) operation which includes ternary symbols, where each ternary symbol can have a positive, zero, or negative voltage value. Additionally or alternatively, the data may be encoded via any technically feasible operation.

Although encoding the write data changes the data to optimize the write data for optimal signal transmission, the encoding operation generates the same output data for a set of input data. Therefore, if the encoded data for a given set of write data presents a pathological data pattern on the memory interface, a replay operation for the same encoded data presents the same pathological data pattern on the memory interface. Therefore, the memory controller, prior to encoding the write data for transmission, scrambles the write data. Data scrambling architecture 200 performs these steps in reverse, by decoding the write data via data decoder 208 and then descrambling the decoded data via descrambler 210. Descrambler 210 receives decoded write data from data decoder 208. Descrambler 210 descrambles the decoded data based on a sequence value received from configuration registers 276, such as sequence value 290, to generate the original data generated by the memory client. Descrambler 210 transmits the original data to memory core 216 for storage.

In parallel, during the write operation, the memory controller performs a CRC operation. More specifically, the memory controller generates an error detection and correction (EDC) code, such as a cyclic redundancy check (CRC) code. The memory controller generates the EDC code, such as a CRC value, from the encoded write data transmitted over the memory interface. The memory controller optionally encodes the EDC code, serializes the EDC code, and transmits the EDC code to the memory device. Data scrambling architecture 200 of the memory device receives the EDC code via one or more EDC I/O pins 226. Receiver 228 receives the EDC code from the EDC I/O pins 226, deserializes the EDC code, and transmits the EDC code to EDC decoder 232. EDC decoder 232 performs a decode operation on the EDC code in the manner described in conjunction with data decoder 208. EDC decoder 232 transmits the decoded EDC code to CRC tester 234. CRC tester 234 performs a CRC operation. More specifically, CRC tester 234 generates a second EDC code based on the encoded write data from receiver 204. CRC tester 234 compares the second EDC code with the EDC code received from EDC decoder 232 and generates a status output 260. If the second EDC code matches the EDC code received from EDC decoder 232, then CRC tester 234 transmits a pass status output 260. If the second EDC code does not match the EDC code received from EDC decoder 232, then CRC tester 234 transmits a fail status output 260.

Additionally or alternatively, the memory device transmits the EDC code for a write data block back to the memory controller. The memory controller performs the CRC testing based on the write data transmitted by the memory controller to the memory device and the EDC code received from the memory. With this approach, the EDC is unidirectional, flowing from the memory controller to the memory device, but not from the memory device to the memory controller.

During a write operation, multiplexor 236 selects the status output 260 and transmits the status output 260 to transmitter 240. Transmitter 240 transmits the status output 260 to the memory controller via read clock (RCK) output pin 242, given that the RCK output pin 242 is otherwise unused during write operations. Additionally or alternatively, the memory device transmits the status output 260 to the memory controller via a separate error status pin. Additionally or alternatively, the memory controller determines whether a write operation resulted in an error via any technically feasible technique.

During a read operation, memory core 216 retrieves the requested read data and transmits the read data to scrambler 218. Scrambler 218 receives the read data from memory core 216. Scrambler 218 scrambles the read data based on a sequence value received from configuration registers 276, such as sequence value 290, to generate scrambled read data. Scrambler 218 transmits the scrambled data to data encoder 220.

Data encoder 220 performs an encode operation on the read data. Read data transmitted by the DRAM to the memory controller via the DQ, DQX I/O pins 202 is typically encoded to optimize the signal transmission over the memory interface, as described herein. Data encoder 220 transmits the encoded data to transmitter 224. Transmitter 224 serializes the encoded read data and transmits the encoded read data to the memory controller via DQ, DQX I/O pins 202. The memory controller, deserializes the read data, optionally decodes the read data, descrambles the read data to generate the original read data, and transmits the original read data to the memory client that requested the data.

Although encoding the read data changes the data to optimize the read data for optimal signal transmission, the encoding operation generates the same output data for a set of input data. Therefore, if the encoded data for a given set of read data presents a pathological data pattern on the memory interface, a replay operation for the same encoded data presents the same pathological data pattern on the memory interface. Therefore, data scrambling architecture 200, prior to encoding the read data for transmission, scrambles the read data.

In parallel, during the read operation, CRC generator 246 receives the encoded read data from data encoder 220. CRC generator 246 performs a CRC operation. More specifically, CRC generator 246 generates an EDC code, such as a CRC value, and transmits the EDC code to EDC encoder 248. EDC encoder 248 transmits the encoded data to transmitter 252. Transmitter 252 serializes the EDC code and transmits the EDC code to the memory controller via EDC I/O pins 226. The memory controller, deserializes the EDC code received via the EDC I/O pins 226. The memory controller generates a second EDC code based on the encoded read data received via the DQ, DQX I/O pins 202. The memory controller compares the second EDC code with the EDC code received from EDC encoder 248 and generates a status output. If the second EDC code matches the EDC code received from EDC encoder 248, then the memory controller generates a pass status output. If the second EDC code does not match the EDC code received from EDC encoder 248, then the memory controller generates a fail status output.

During a read operation, multiplexor 236 selects the output of read clock (RCK) generator 238 and transmits the output of RCK generator 238 to transmitter 240. Transmitter 240 transmits the output of RCK generator 238 to the memory controller via RCK output pin 242, thereby providing a read clock signal by which the memory controller samples the read data received via DQ, DQX I/O pins 202 and the EDC code received via EDC I/O pins 226.

When the memory controller detects an EDC error on a write operation or a read operation, the memory controller executes a replay operation to repeat the write operation or read operation. During a write operation, the memory controller detects an EDC error when the memory controller receives a fail status output 260 from CRC tester 234 via RCK output pin 242. During a read operation, the memory controller generates an EDC code, such as a CRC value, based on the data received via DQ, DQX I/O pins 202. The memory controller detects an EDC error when the EDC code received from CRC generator 246 via EDC I/O pins 226 does not match the EDC code generated by the memory controller.

As described herein, the replay operation writes or reads the same data as the original write operation or read operation. However, the data for the replay operation is scrambled such that the data transmitted over the memory interface is different during the replay operation than during the original write operation or read operation. As a result, a pathological data pattern that caused the EDC error during the original write operation or read operation is unlikely to be repeated during the replay operation.

As described herein, a sequence generator included in a memory controller generates a series of sequence values, such as sequence value 290, for descrambling data during write operations and scrambling data during read operations. The memory controller transmits commands to the data scrambling architecture 200 to cause the data scrambling architecture 200 to store one or more of the sequence values in configuration registers. In some examples, the sequence generator included in the memory controller includes a single generator for generating sequence values for all of the DQ, DQX I/O pins 202. In some examples, the sequence generator includes a separate generator for each of the DQ, DQX I/O pins 202. In these latter examples, the sequence generator generates separate and unique sequence values for each of the DQ, DQX I/O pins 202.

It will be appreciated that the system shown herein is illustrative and that variations and modifications are possible. Among other things, the memory controller scrambles write data prior to performing data encoding for transmitting the data signals over the memory interface. The memory device first decodes the write data via data decoder 208 before descrambling the write data via descrambler 210 and storing the write data in memory core 216. Similarly, the memory device scrambles read data via scrambler 218 prior to performing data encoding via data encoder 220 for transmitting the data signals over the memory interface. The memory controller first decodes the read data before descrambling the read data and transmitting the read data to the memory client. Because data scrambling is performed prior to data encoding, scrambling the data to avoid repeated pathological data patterns does not negatively impact encoding to optimize the signal quality for transmission over the memory interface.

In some examples, data scrambling architecture 200 includes components decoding and encoding the data for transmission between the memory controller and the DRAM. In some examples, the data transmitted between the memory controller and the DRAM is not encoded. In such examples, data scrambling architecture 200 may not include one or more of data decoder 208, EDC decoder 232, data encoder 220, and EDC encoder 248.

In some examples, the memory device utilizes a single sequence value with one or more pins for transmitting read or write date (such as, one or more DQ, DQX I/O pins 202 of a DRAM). Additionally or alternatively, the memory device utilizes multiple sequence values may so that different sets of one or more pins utilize different sequence values.

In some examples, when scrambling and/or descrambling data, the memory device applies one or more logical operations (such as XOR, AND, OR, and/or other logical operations) and/or applying one or more logical bitwise shift operations on the data based on the sequence value.

In some examples, the memory controller can transmit one or more sequence values to the memory (prior to one or more read and/or write transactions being performed. The memory controller can transmit the sequence values during a setup or pre-configuration phase of the memory interface, on a periodic bases, and/or at any other time. The memory device can store the sequence values in any suitable storage, such as memory core 216, configuration registers 276, and/or the like. Upon detecting an error on a read or write, the memory controller enables one of the pre-configured scrambled codes, by sending a command on an interface, such as the CMD pins 270, to the memory device.

In some examples, the memory controller and the memory device include a pre-determined set of one or more sequence values. Upon detecting an error on a read or write, the memory controller enables one of the pre-determined sequence values, by sending a command on an interface, such as the CMD pins 270, to the memory.

In some examples, the memory controller detects an error (such as a command bus parity error) indicating that a command was not transmitted properly to the memory device. If the memory controller detects such an error, the memory controller updates the sequence value being used by the memory device before resuming any read or write operations. Doing so serves as a precaution against the possibility that the memory is using an incorrect or corrupt sequence value.

In some examples, the memory device detects an error (such as a command bus parity error) indicating that a command was not transmitted properly to the memory device. If such an error is detected, the memory device updates the sequence value being used to a previously agreed upon default value (such as a sequence value comprising of an n-bit value where all bits have a 0 value). Upon notification of such an error (either by the memory device notifying the memory controller, the memory controller self-detecting the error, and/or the like), the memory controller also uses the default value as the sequence value. Thereafter, the memory controller can choose to update the sequence value used by the memory controller and the memory as described herein.

Although the above embodiments are described with the memory controller initiating the use of a sequence value to scramble data being transmitted between the memory controller and the memory, the memory device can additionally or alternatively initiate the use of the sequence value.

Additionally or alternatively, although the above embodiments are described as enabling data scrambling when an error is detected, the memory controller and/or the memory device can enable data scrambling prior to any error being detected.

Figure 3:
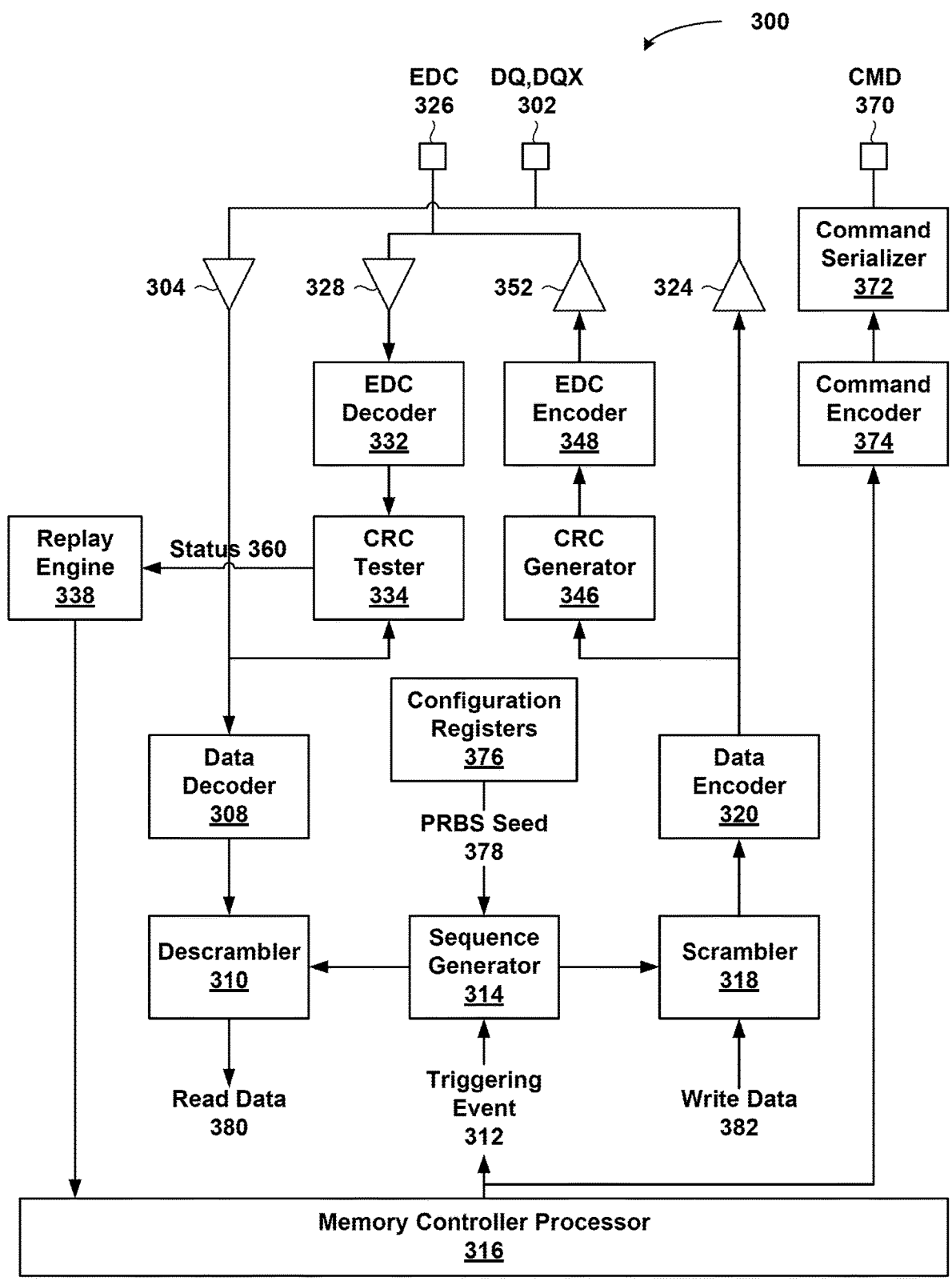
FIG. 3 is a block diagram of a data scrambling architecture for a memory controller, such as the system memory controller or the PPS memory controller of the computer system of FIG. 1, according to various embodiments.

FIG. 3 is a block diagram of a data scrambling architecture 300 for a memory controller, such as the system memory controller 130 or the PPS memory controller 132 of the computer system of FIG. 1, according to various embodiments. As further described, data scrambling architecture 300 includes components to support data scrambling during write operations and data descrambling during read operations. The components of data scrambling architecture 300 function similarly to like named components of data scrambling architecture 200 of FIG. 2 and additionally function as described below.

The memory controller includes a memory controller processor 316 that transmits signals to the memory devices included in system memory 104 and/or PP memory 134 to initiate the memory devices, transmit commands to the memory devices, write data to the memory devices, read data from the memory devices, and/or the like. Memory controller processor 316 generates commands for transmitting to a memory device and transmits the commands to a command encoder 374. Command encoder 374 translates the commands into a form that is readable by the memory device and transmits the commands to a command serializer 372. Command serializer 372 serializes the commands and transmits the serialized commands to the memory device via command (CMD) pins 370. In some examples, command encoder 374 translates commands received from memory controller processor 316 into twenty-bit words. Command serializer 372 serializes the twenty-bit words into four partial commands of five bits each. Command serializer 372 transmits the four partial commands to the memory device via CMD pins 370.

During read operations and write operations, and if data scrambling is enabled, memory controller processor 316 transmits triggering events 312 to sequence generator 314, resulting in a synchronization operation. The triggering event 312 may be in the form of a command, signal, and/or the like transmitted by memory controller processor 316 and received by sequence generator 314. A first type of synchronization operation resulting from the triggering event 312 initializes sequence generator 314 to a known state in order to generate a sequence value. A second type of synchronization operation resulting from the triggering event 312 causes sequence generator 314 to change from generating a current sequence value to generating a next sequence value. When sequence generator 314 is initialized, sequence generator 314 loads a PRBS seed value 378 from configuration registers 376 to generate an initial sequence value. When sequence generator 314 is advanced, sequence generator 314 advances from generating a current sequence value to a next sequence value. Additionally or alternatively, sequence generator 314 may include and may enable or disable various components of data scrambling, such as a linear feedback shift register, a pseudorandom number generator, inversion logic, swap logic, shift logic, and/or the like. Memory controller processor 316 initializes and advances sequence generator 314 along with configuration registers 276 on the memory device in order to maintain synchronization between sequence generator 314 and configuration registers 276. In this manner, data scrambling architecture 300 can descramble data received from data scrambling architecture 200, and data scrambling architecture 200 can descramble data received from data scrambling architecture 300.

In some examples, sequence generator 314 includes a first generator to generate sequence values for write operations and a second generator to generate sequence values for read operations. Separate generators for write operations and read operations can be employed for memory devices that are able to perform concurrent write operations and read operations. In some examples, sequence generator 314 includes a single generator to generate sequence values for write operations and sequence values for read operations. A single common generator for write operations and read operations can be employed for memory devices that are unable to perform concurrent write operations and read operations. Each of descrambler 310 and scrambler 318 perform a predetermined operation on and the sequence value received from sequence generator 314 and the input data received from data decoder 308 (for read operations) or from write data 382 (for write operations). The predetermined operation may include logical operations, arithmetic operations, and/or the like. Logical operations may include bitwise exclusive or (XOR) operations, exclusive not-or (XNOR) operations, and/not-and (AND/NAND) operations, or/not-or (OR/NOR) operations, and/or the like. Arithmetic operations may include addition operations, subtraction operations, multiplication operations, and/or the like.

The memory controller processor 316 transmits triggering event 312 to synchronize sequence generator 314 with the sequence numbers stored in configuration registers 276 of the data scrambling architecture 200. The triggering event 312 causes sequence generator 314 to initiate to a known state. Upon initiating to a known state, sequence generator 314 generates a first sequence value. Thereafter, sequence generator 314 advances from a current sequence value to a next sequence value each time the memory controller processor 316 transmits a subsequent triggering event 312. Similarly, upon initiating to a known state, the configuration registers 276 output the same first sequence value as sequence value 290. Thereafter, the sequence generator 314 advances from a current sequence value to a next sequence value each time the memory controller processor 316 transmits a subsequent triggering event 312 to the sequence generator 314. Similarly, the configuration registers 276 advances from a current stored sequence value to a next stored sequence value and outputs the next sequence value as sequence value 290. In this manner, the sequence generator 314 and the sequence value 290 transmitted by the configuration registers 276 remain synchronized with one another.

In some examples, the memory controller processor 316 transmits a triggering event 312 to advance sequence generator 314 and perform scrambling and/or descrambling during every write operation and every read operation. In such examples, descrambler 310 may descramble data during each original write operation and each replay write operation. Similarly, scrambler 318 may scramble data during each original read operation and each replay read operation. Because scrambled data is transmitted over the memory interface during operation, scrambling may convert original data that is benign to the memory interface into a pathological data pattern. However, the data will be scrambled with a different sequence value during the replay operation. As a result, the scrambled data transmitted over the interface is different with each subsequent operation, even if the original data is the same for multiple consecutive operations.

In some examples, the memory controller processor 316 transmits a triggering event to the memory device to advance the sequence value 290 and perform scrambling and/or descrambling only during replay operations. In such examples, descrambler 210 may descramble data only during replay write operations. Similarly, scrambler 218 may scramble data only during replay read operations.

The sequence value 290, in conjunction with descrambler 210 and scrambler 218, descramble write data and scramble read data via any combination of one or more technically feasible techniques.

In some examples, the triggering event 312 causes the sequence generator 314 to load an initial seed value and/or polynomial into a linear feedback shift register (LFSR) included within sequence generator 314. As described herein, the memory controller processor 316 generates the triggering event 312 when the memory controller processor 316 receives a read command or a write command and data scrambling is enabled. Similarly, the configuration registers 276 of the data scrambling architecture 200 transmits a first sequence value and/or advances from a current sequence value to a next sequence value when the data scrambling architecture 200 receives a read command or a write command and data scrambling is enabled. The LFSR may support any PRBS format such as a PRBS-15 sequence, a PRBS-7 sequence, and/or the like. The polynomial may be any suitable polynomial for the PRBS format. For example, a PRBS-15 sequence can be represented by the polynomial $x^{15}+x^{14}+1$. Each the generators for the various DQ and DQX bits may be initialized with the same seed value and/or polynomial or with different seed values and/or polynomials, in any combination.

The memory controller processor 316 initializes the seed value and/or polynomial of the LFSR included within sequence generator 314 via an descrambled interface, such as a command address interface, and/or a second scrambled interface. Additionally or alternatively, the memory controller processor 316 initializes the seed value and/or polynomial of the LFSR by triggering the sequence generator 314 to load a predetermined seed value and/or polynomial into the LFSR. The memory controller processor 316 causes the configuration registers 276 of the data scrambling architecture 200 to transmit a first sequence value and/or to advance from a current sequence value to a next sequence value when the data scrambling architecture 200 receives a read command or a write command and data scrambling is enabled. The LFSR included in sequence generator 314 and the sequence value 290 transmitted by the configuration registers 276 are thereby synchronized.

Once the initial synchronization is completed, the LFSRs in sequence generator 314 and the sequence values 290 transmitted by the configuration registers 276 are concurrently advanced to generate a pseudo-random output to scramble and/or descramble the write data and/or the read data. When the LFSRs are triggered, the LFSR in the sequence generator 314 shifts out a random sequence, and the configuration registers 276 transmits a corresponding series of sequence values 290, which is then used to descramble the write data or scramble the read data.

In some examples, a pseudo-random number generator (PRNG) that generates a pseudo-random bit sequence may be used in place of a LFSR. In such examples, sequence generator 314 is initially synchronized using the same PRNG seed value. When the PRNGs are triggered, the PRNG in each of sequence generator 314 and the memory controller produces a deterministic random value. The random value is then be used to descramble the write data or scramble the read data.

In some examples, inversion logic units perform inversion operations in addition to or in place of the LFSRs and/or PRNGs. In such examples, each inversion logic unit in sequence generator 314 and the memory controller are initially synchronized. When triggered, the inversion logic units invert the logic level of each symbol to descramble the write data or scramble the read data. As used herein, a symbol is a set of one or more bits of write data or read data. Additionally or alternatively, the inversion logic units invert the logic level of every other symbol, every third symbol, every $n^{th}$ symbol (where n is an integer), a predetermined sequence of symbols, and/or the like.

In some examples, swap logic units perform swap operations in addition to or in place of the LFSRs, and/or PRNGs, and/or inversion logic. In such examples, each swap logic unit in sequence generator 314 and the memory controller are initially synchronized. When triggered, the swap logic units swap the order in which symbols are transmitted or cause the symbols to be transmitted in some predetermined sequence that differs from the original sequence of the symbols.

In some examples, shift logic units perform shift operations in addition to or in place of the LFSRs, and/or PRNGs, inversion logic, and/or swap logic. In such examples, each shift logic unit in sequence generator 314 and the memory controller are initially synchronized. When triggered, the shift logic units shift the bits in one or more symbols by one or more bit positions or cause the symbols to be shifted with respect to one another in some predetermined sequence that differs from the original sequence of the symbols and the bits therein.

In some examples, the LFSRs, PRNGs, inversion logic units, swap logic units, and/or shift logic units are triggered based on a triggering event, such as triggering event 312. Such a triggering event 312 may be, for example, a detection of a read command or a write command on a command interface, a detection of an error during the reading or writing of data, and/or the like. The triggering event 312 further causes the configuration registers 276 to transmit a next sequence value 290. In this manner, the memory device synchronizes data scrambling operations performed by the memory device with data scrambling operations performed by the memory controller.

During a read operation, data scrambling architecture 300 receives data via DQ, DQX I/O pins 302. Receiver 304 transmits the data received from DQ, DQX I/O pins 302 to data decoder 308. Data decoder 308 performs a decode operation on the read data. The decode operation may include an MTA decode operation, a DBI decode operation, a PAM3 operation, and/or the like. Data decoder 308 transmits the decoded read data to descrambler 310. If data scrambling is enabled, then descrambler 310 descrambles the decoded read data to recover the original read data 380 stored in memory core 216 of the memory device. Descrambler 310 transmits the original read data 380 to the memory client that requested the data.

In addition, receiver 304 transmits the data received from DQ, DQX I/O pins 302 to CRC tester 334. CRC tester 334 also receives an EDC code via EDC I/O pins 326. Receiver 328 transmits the data received from EDC I/O pins 326 to EDC decoder 332. EDC decoder 332 performs a decode operation on the EDC code. The decode operation may include an MTA decode operation, a DBI decode operation, a PAM3 operation, and/or the like. EDC decoder 332 transmits the decoded EDC code to CRC tester 334. CRC tester 334 compares the EDC code received from EDC decoder 332 with a second EDC code generated by CRC tester 334 from the read data. If CRC tester 334 does not detect an EDC error, then CRC tester 334 transmits a pass status 360 to replay engine 338. If CRC tester 334 detects an EDC error, then CRC tester 334 transmits a fail status 360 to replay engine 338. Upon receiving a fail status 360, replay engine 338 initiates a replay of the read operation that resulted in failure. Replay engine 338 transmits the initiated replay read operation to memory controller processor 316. Memory controller processor 316 schedules the replay read operation to be retried. In so doing, memory controller processor 316 advances sequence generator 314 via a triggering event 312. In addition, memory controller processor 316 causes configuration registers 276 to transmit a next sequence value 290. In this manner, the read data during the replay read operation is scrambled differently than the original read data. Additionally or alternatively, the read data during the replay read operation is scrambled whereas the original read data is not scrambled.

During a write operation, scrambler 318 receives write data 382 from the memory client that is writing to the memory device. If data scrambling is enabled, then scrambler 318 scrambles the write data and transmits the scrambled data to data encoder 320. Data encoder 320 performs an encode operation on the scrambled write data. The encode operation may include an MTA encode operation, a DBI encode operation, a PAM3 operation, and/or the like. Data encoder 320 transmits the encoded write data to transmitter 324. Transmitter 324 transmits the encoded write data to the memory device via DQ, DQX I/O pins 302.

In addition, data encoder 320 transmits the encoded data to CRC generator 346. CRC generator 346 generates an EDC code from the encoded write data and transmits the EDC code to EDC encoder 348. EDC encoder 348 performs an encode operation on the EDC code. The encode operation may include an MTA encode operation, a DBI encode operation, a PAM3 operation, and/or the like. EDC encoder 348 transmits the encoded EDC code to transmitter 352. Transmitter 352 transmits the EDC code to the memory device via EDC I/O pins 326.

If the memory detects an EDC error based on the write data received via DQ, DQX I/O pins 302 and the EDC code received via EDC I/O pins 326, then the memory device transmits a fail status (not shown) to replay engine 338. Upon receiving a fail status from the memory device, replay engine 338 initiates a replay of the write operation that resulted in failure. Replay engine 338 transmits the initiated replay write operation to memory controller processor 316. Memory controller processor 316 schedules the replay write operation to be retried. In so doing, memory controller processor 316 advances sequence generator 314 via a triggering event 312. In addition, memory controller processor 316 causes configuration registers 276 to transmit a next sequence value 290. In this manner, the write data during the replay write operation is scrambled differently than the original write data. Additionally or alternatively, the write data during the replay write operation is scrambled whereas the original write data is not scrambled.

In some examples, the LFSRs, PRNGs, inversion logic units, swap logic units, and/or shift logic units are triggered based on a triggering event, such as triggering event 312. Such a triggering event 312 may be, for example, a detection of a read command or a write command on a command interface, a detection of an error during the reading or writing of data, and/or the like. In this manner, the memory device synchronizes data scrambling operations performed by the memory device with data scrambling operations performed by the memory controller.

Figure 4:
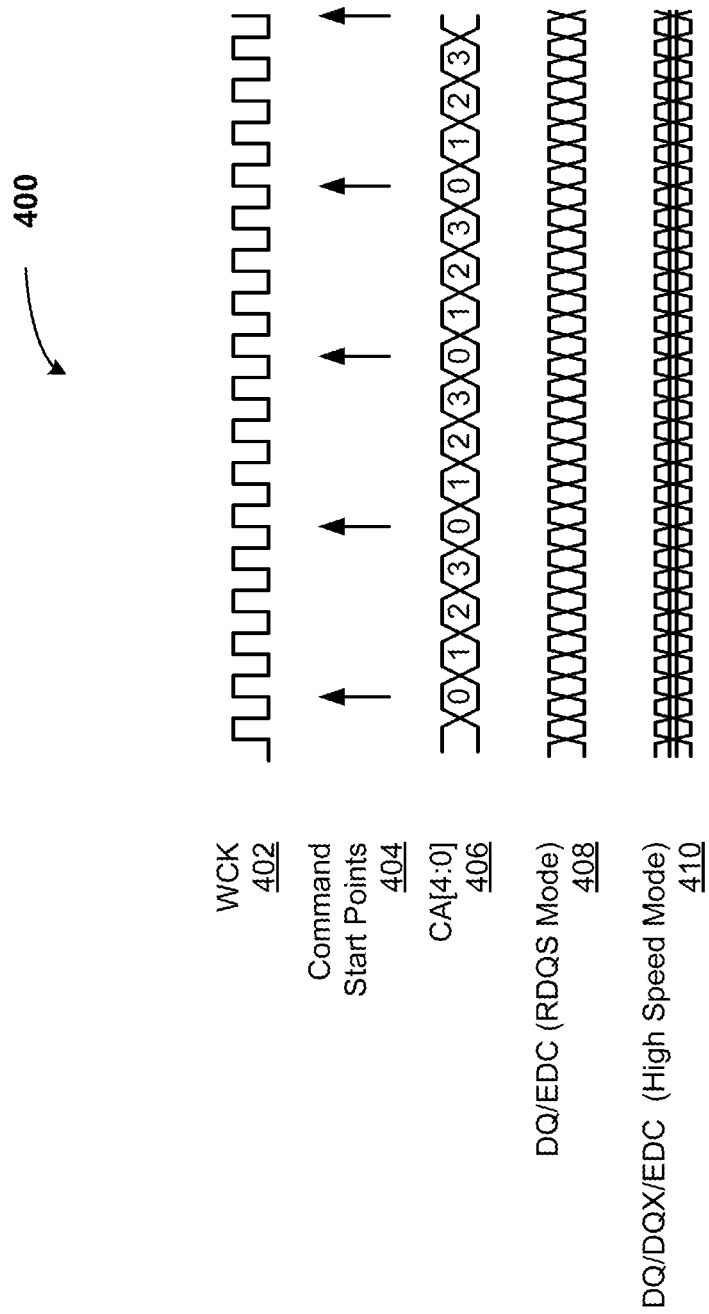
FIG. 4 is a timing diagram illustrating the transfer of successive commands to a memory device included in system memory and/or parallel processing memory of the computer system of FIG. 1, according to various embodiments.

FIG. 4 is a timing diagram 400 illustrating the transfer of successive commands to a memory device included in system memory 104 and/or parallel processing memory 134 of the computer system of FIG. 1, according to various embodiments.

As shown, a high-speed clock signal, labeled WCK 402, provides a single clock signal for commands and data. The command interface includes any number of I/O pins for transferring the command to the memory device. In some embodiments, the command interface includes five I/O pins, labeled CA[4:0] 406.

Five command start points 404 are shown in FIG. 4, where each command start point 404 is coincident with a rising edge of WCK 402 coincident with phase 0 of a four-phase command. Three successive phases 1, 2, 3 of a command are coincident with three successive rising edges of WCK 402. The rising clock edge of WCK 402 following phase 3 of a command is followed by a command start point 404 for phase 0 of the following command.

Data transferred to and from the memory device may include main data bits (DQ), extended data bits (DQX), and error detection bits (EDC). The error detection bits are used to detect and/or correct bit errors in the main data bits and/or extended data bits via any technically feasible error detection and correction code, such as a cyclic redundancy check (CRC) code.

The memory device may employ multiple data signaling modes based on different data transfer modes. For example, DQ and EDC data bits may employ a redundant data strobe (RDQS) data transfer mode, as shown in the DQ/EDC 408 timing diagram. In such cases, the DQ and EDC data bits may be encoded via an NRZ data signaling mode. In RDQS data transfer mode, data is transmitted to and from the memory device as one-bit symbols captured at twice the rate of command phases, on every rising edge and every falling edge of WCK 402. Therefore, each DQ and EDC symbol includes one bit of data. Additionally or alternatively, the data transmitted to and from the memory device may employ a data transfer mode that transfers symbols that include two or more bits of data. In one example, the DQ, DQX, and EDC data bits may be encoded via a high-speed multilevel mode with symbols that carry more than one bit of data. One such data transfer mode is the 4-level pulse amplitude modulation (PAM4) data transfer mode that employs two-bit symbols, as shown in the DQ/DQX/EDC 410 timing diagram. In PAM 4 mode, data is transmitted to and from the memory device as two-bit symbols captured at twice the rate of command phases, on every rising edge and every falling edge of WCK 402. The PAM4 data transfer mode allows each data I/O pin to carry two bits of data that are captured on every rising edge and every falling edge of WCK 402. Therefore, in PAM4 data transfer mode, the data transfer rate is four times the command transfer rate. Whether the memory device operates in RDQS mode, PAM4 mode, or any other data transfer mode, the same clock signal WCK 402 captures both the command bits and the data bits.

It will be appreciated that the system shown herein is illustrative and that variations and modifications are possible. Among other things, a single command word may include multiple groups of four phases. In some examples, a single command word may include a multiple of four phases, such as eight phases, twelve phases, and/or the like. In such examples each command is transmitted over multiple four-phase commands via the CA[4:0] I/O pins. For a single command that includes eight phases, the command is transmitted as two successive four-phase commands. As the memory controller transmits the first four-phase command to the memory device, the memory device recognizes that the command is an eight-phase command. The memory device receives the first four phases of the command starting with a certain command start point 404 and receives the second four phases of the command starting with the next consecutive command start point 404. Similarly, for a single command that includes twelve phases, the command is transmitted as three successive four-phase commands. As the memory controller transmits the first four-phase command to the memory device, the memory device recognizes that the command is a twelve-phase command. The memory device receives the first four phases of the command starting with a certain command start point 404 and receives the second four phases and the third four phases of the command starting with the next two consecutive command start points 404, and so on.

In another example, the commands transferred by the memory controller to the memory device are described as up to 24 command bits transmitted as four phases of five bits. However, the number of phases may be more than four phases or fewer than four phases, within the scope of the disclosed embodiments Further, the number of command bits may be more than five bits or fewer than five bits, within the scope of the disclosed embodiments. In yet another example, the signals disclosed herein are described in terms of rising and/or falling edges, high or low levels, and/or the like. However, rising edges and falling edges may be interchanged, high levels and low levels may be interchanged, and any other technically feasible changes may be made with respect to signal edges and levels within the scope of the disclosed embodiments.

Figure 5:
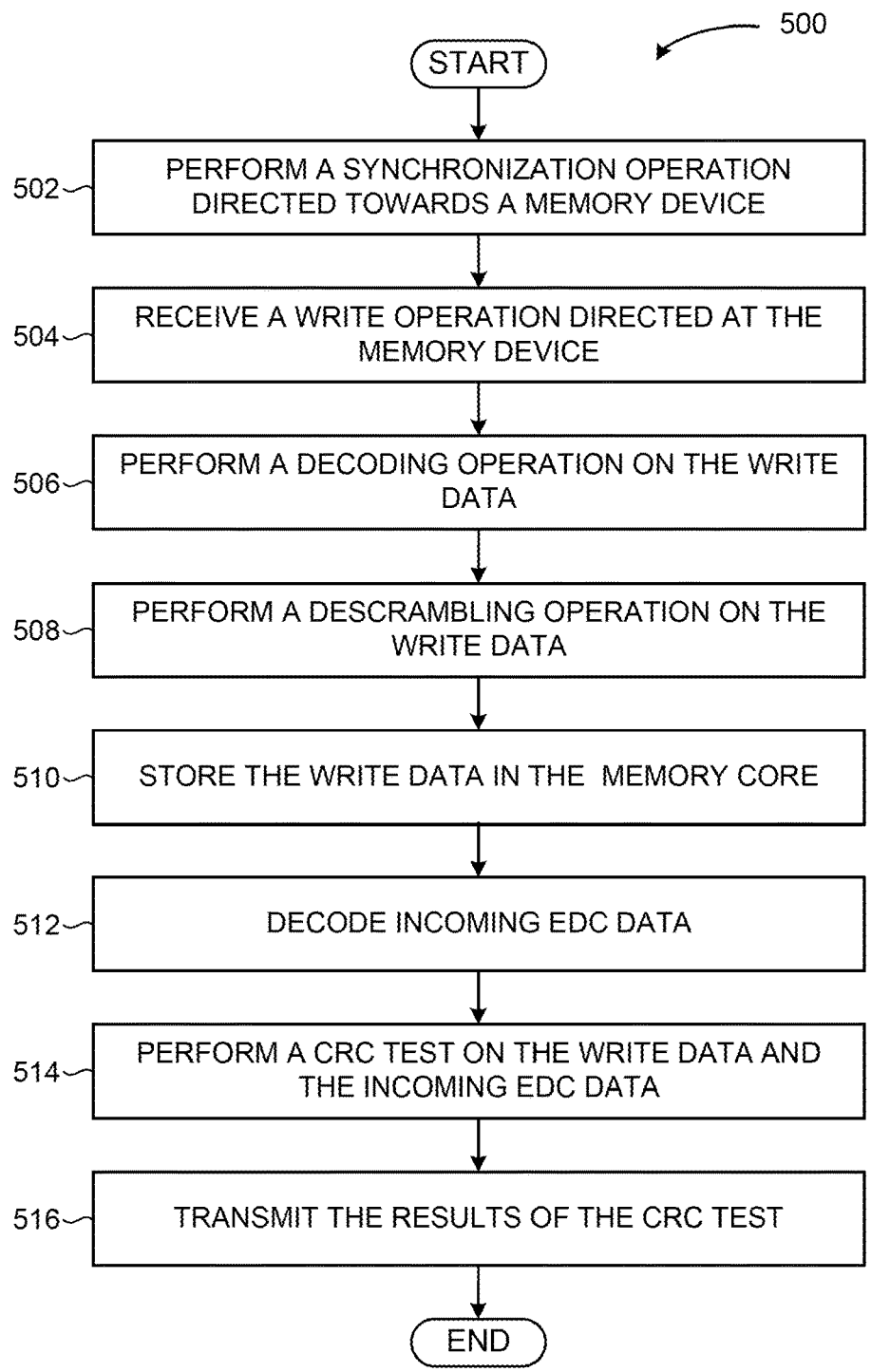
FIG. 5 is a flow diagram of method steps for performing a write operation via the data scrambling architecture of FIG. 2, according to various embodiments.

FIG. 5 is a flow diagram of method steps for performing a write operation via the data scrambling architecture 200 of FIG. 2, according to various embodiments. Although the method steps are described in conjunction with the systems of FIGS. 1-4, persons of ordinary skill in the art will understand that any system configured to perform the method steps, in any order, is within the scope of the present disclosure.

As shown, a method 500 begins at step 502, where a memory device performs a synchronization operation directed towards a memory device that includes a data scrambling architecture 200. The memory device performs the synchronization operation in response to a triggering event received via a command interface from a memory controller, such as system memory controller 130 associated with one or more CPUs 102 and/or PPS memory controller 132 associated with one or more parallel processing subsystems 112. The triggering event may be in the form of a command, signal, and/or the like transmitted by the memory controller and received by the memory device. A first type of synchronization operation resulting from the triggering event causes configuration registers 276 to transmit an initial sequence value. A second type of synchronization operation resulting from the triggering event causes configuration registers 276 to transmit to change from transmitting a current sequence value to transmitting a next sequence value. The memory controller may transmit the triggering event for this second type of synchronization operation with every read operation and/or write operation directed to the memory device. In some examples, the memory controller transmits a command to the memory device that causes the memory device to generate the triggering event. Additionally or alternatively, the memory device generates the triggering event when the memory controller detects an EDC error and data scrambling is enabled. Additionally or alternatively, the memory controller may transmit the triggering event for this second type of synchronization operation only with replay operations resulting from a failed read operation and/or a failed write operation directed to the memory device.

More specifically, the memory controller transmits triggering event to the memory device and simultaneously transmits a triggering event 312 to a sequence generator 314 included in the memory controller. The triggering event transmitted to the memory device causes configuration registers 276 to transmit an initial sequence value. Thereafter, subsequent triggering events transmitted by the memory controller to the memory device causes configuration registers 276 to advance from transmitting a current sequence value to transmitting a next sequence value. Similarly, upon initiating to a known state, the sequence generator 312 included in the memory controller generates the same first sequence value. Thereafter, the sequence generator included in the memory controller advances from a current sequence value to a next sequence value each time the memory controller transmits a subsequent triggering event to the memory device. In this manner, the sequence generator included in the memory controller and configuration registers 276 in the memory device remain synchronized with one another.

At step 504, the memory device receives a write operation directed at the memory device. Typically, the memory device receives write operations from the memory controller. The memory device receives the write data via one or more DQ, DQX I/O pins 202. A receiver 204 receives the write data from the DQ, DQX I/O pins 202, deserializes the write data, and transmits the write data to a data decoder 208 included in the memory device.

At step 506, data decoder 208 performs a decoding operation on the write data received in step 504. Write data transmitted by the memory controller to the DQ, DQX I/O pins 202 is typically encoded to optimize the signal transmission over the memory interface. The goal of transmitting encoded data over the physical I/O layer between the memory controller and the memory device is to optimize the data for signal transmission. The encoding optimizes the data to minimize transitions on the interface, to minimize crosstalk, to reduce the amount of direct current (DC) power consumed by termination circuit on the interface, and/or the like. The data may be encoded via an MTA operation, which reduces the number of low-to-high and/or high-to-low signal transitions in order to improve the signal-to-noise ratio on the memory interface. Additionally or alternatively, the data may be encoded via a DBI operation in order to reduce the number of high signal values on the memory interface in order to reduce power consumed over the memory interface. Additionally or alternatively, the data may be encoded via a PAM3 operation which includes ternary symbols, where each ternary symbol can have a positive, zero, or negative voltage value. Additionally or alternatively, the data may be encoded via any technically feasible operation.

At step 508, a descrambler 210 included in the memory device performs a descrambling operation on the write data. Although encoding the write data changes the data to optimize the write data for optimal signal transmission, the encoding operation generates the same output data for a set of input data. Therefore, if the encoded data for a given set of write data presents a pathological data pattern on the memory interface, a replay operation for the same encoded data presents the same pathological data pattern on the memory interface. Therefore, the memory controller, prior to encoding the write data for transmission, scrambles the write data. The memory device performs these steps in reverse, by decoding the write data via data decoder 208 and then descrambling the decoded data via descrambler 210. Descrambler 210 receives decoded write data from data decoder 208. Descrambler 210 descrambles the decoded data based on a sequence value 290 received from configuration registers 276 included in the memory device to generate the original data generated by the memory client. Descrambler 210 transmits the original data to memory core 216 for storage. At step 510, descrambler 210 stores the write data in a memory core 216 included in the memory device.

At step 512, an error correction and detection (EDC) decoder 232 decodes incoming EDC code received via the EDC I/O pins 226. During the write operation, the memory controller performs a CRC operation. Mode specifically, the memory controller generates an EDC code, such as a CRC value. The memory controller generates the EDC code from the encoded write data transmitted over the memory interface. The memory controller optionally encodes the EDC code, serializes the EDC code, and transmits the EDC code to the memory device. The memory device receives the EDC code via one or more EDC I/O pins 226. Receiver 228 receives the EDC code from the EDC I/O pins 226, deserializes the EDC code, and transmits the EDC code to EDC decoder 232. EDC decoder 232 performs a decode operation on the EDC code in the manner described in conjunction with data decoder 208. EDC decoder 232 transmits the decoded EDC code to a CRC tester 234.

At step 514, CRC tester 234 performs a CRC test on the write data and the incoming EDC code. CRC tester 234 performs a CRC operation. More specifically, CRC tester 234 generates a second EDC code, such as a CRC value, based on the encoded write data from receiver 204. CRC tester 234 compares the second EDC code with the EDC code received from EDC decoder 232 and generates a status output 260. If the second EDC code matches the EDC code received from EDC decoder 232, then CRC tester 234 transmits a pass status output 260. If the second EDC code does not match the EDC code received from EDC decoder 232, then CRC tester 234 transmits a fail status output 260.

At step 516, a multiplexor 236 included in the memory device transmits the CRC test result in the form of status output 260 to the memory controller. During a write operation, multiplexor 236 selects the status output 260 and transmits the status output 260 to transmitter 240. Transmitter 240 transmits the status output 260 to the memory controller via RCK output pin 242, given that the RCK output pin 242 is otherwise unused during write operations. The method 500 then terminates.

Figure 6:
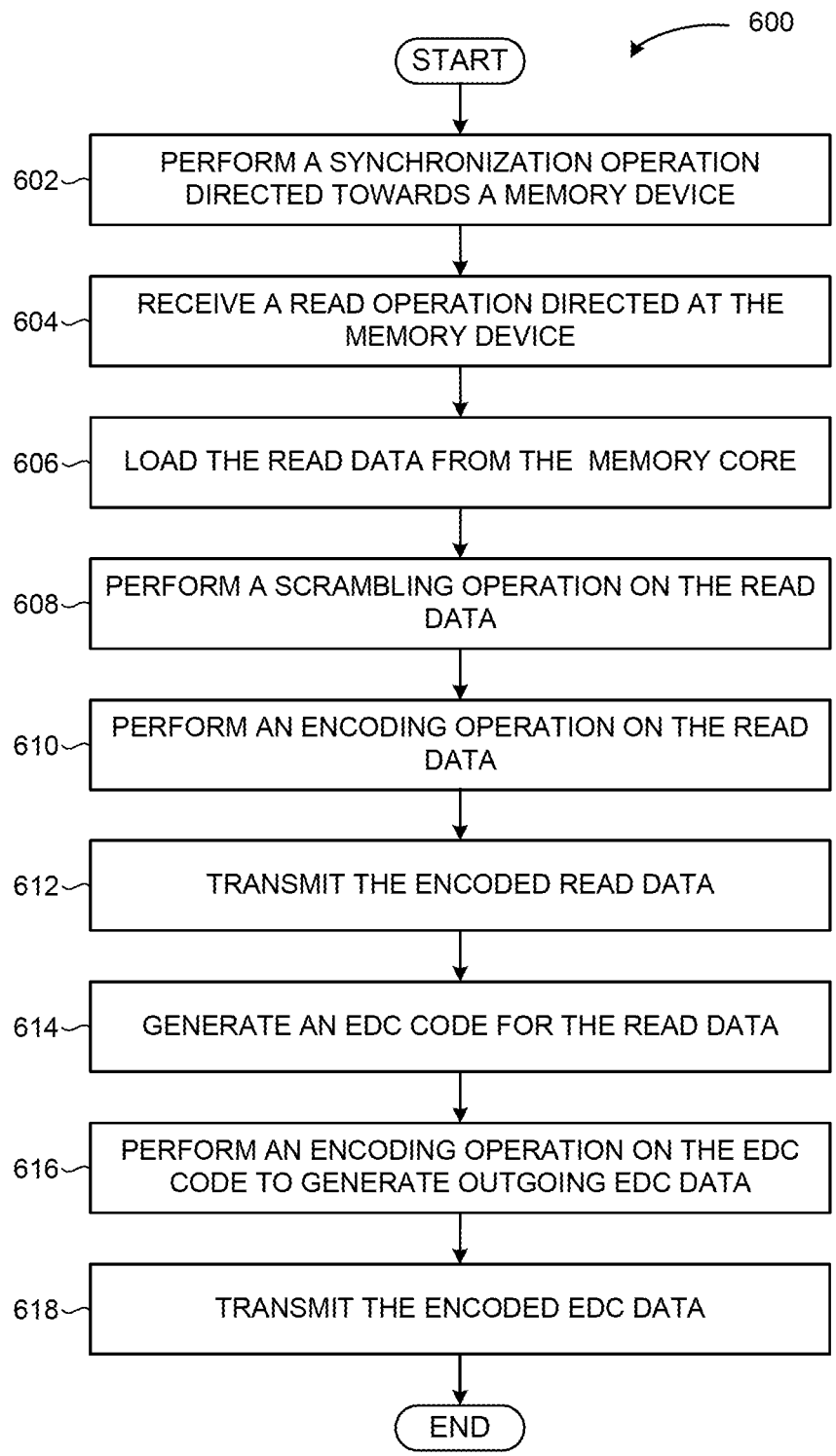
FIG. 6 is a flow diagram of method steps for performing a read operation via the data scrambling architecture of FIG. 2, according to various embodiments.

FIG. 6 is a flow diagram of method steps for performing a read operation via the data scrambling architecture 200 of FIG. 2, according to various embodiments. Although the method steps are described in conjunction with the systems of FIGS. 1-4, persons of ordinary skill in the art will understand that any system configured to perform the method steps, in any order, is within the scope of the present disclosure.

As shown, a method 600 begins at step 602, where a memory device, where a memory device performs a synchronization operation directed towards a memory device that includes a data scrambling architecture 200. The memory device performs the synchronization operation in response to a triggering event received via a command interface from a memory controller, such as system memory controller 130 associated with one or more CPUs 102 and/or PPS memory controller 132 associated with one or more parallel processing subsystems 112. The triggering event may be in the form of a command, signal, and/or the like transmitted by the memory controller and received by the memory device. A first type of synchronization operation resulting from the triggering event causes configuration registers 276 to transmit an initial sequence value. A second type of synchronization operation resulting from the triggering event causes configuration registers 276 to transmit to change from transmitting a current sequence value to transmitting a next sequence value. The memory controller may transmit the triggering event for this second type of synchronization operation with every read operation and/or write operation directed to the memory device. Additionally or alternatively, the memory controller may transmit the triggering event for this second type of synchronization operation only with replay operations resulting from a failed read operation and/or a failed write operation directed to the memory device.

More specifically, the memory controller transmits triggering event to the memory device and simultaneously transmits a triggering event 312 to a sequence generator 314 included in the memory controller. The triggering event transmitted to the memory device causes configuration registers 276 to transmit an initial sequence value. Thereafter, subsequent triggering events transmitted by the memory controller to the memory device causes configuration registers 276 to advance from transmitting a current sequence value to transmitting a next sequence value. Similarly, upon initiating to a known state, the sequence generator 312 included in the memory controller generates the same first sequence value. Thereafter, the sequence generator included in the memory controller advances from a current sequence value to a next sequence value each time the memory controller transmits a subsequent triggering event to the memory device. In this manner, the sequence generator included in the memory controller and configuration registers 276 in the memory device remain synchronized with one another.

At step 604, the memory device receives a read operation directed at the memory device. Typically, the memory device receives read operations from the memory controller.

At step 606, the memory device loads the descrambled read data from the memory core 216 of the memory device. During a read operation, memory core 216 retrieves the requested read data and transmits the read data to a scrambler 218 included in the memory device. At step 608, scrambler 218 performs a scrambling operation on the read data. Scrambler 218 receives the read data from memory core 216. Scrambler 218 scrambles the read data based on a sequence value 290 received from configuration registers 276 to generate scrambled read data. Although encoding the read data changes the data to optimize the read data for optimal signal transmission, the encoding operation generates the same output data for a set of input data. Therefore, if the encoded data for a given set of read data presents a pathological data pattern on the memory interface, a replay operation for the same encoded data presents the same pathological data pattern on the memory interface. Therefore, scrambler 218, prior to encoding the read data for transmission, scrambles the read data. Scrambler 218 transmits the scrambled data to a data encoder 220 included in the memory device.

At step 610, data encoder 220 performs an encoding operation on the read data. Read data transmitted by the memory device to the memory controller via the DQ, DQX I/O pins 202 is typically encoded to optimize the signal transmission over the memory interface, as described herein. Data encoder 220 transmits the encoded data to a transmitter 224 included in the memory device. At step 612, transmitter 224 transmits the encoded read data to the memory controller. Transmitter 224 serializes the encoded read data and transmits the encoded read data to the memory controller via DQ, DQX I/O pins 202. The memory controller, deserializes the read data, optionally decodes the read data, descrambles the read data to generate the original read data, and transmits the original read data to the memory client that requested the data.

At step 614, a CRC generator 246 included in the memory device generates an EDC code, such as a CRC value, for the read data. During the read operation, CRC generator 246 receives the encoded read data from data encoder 220. CRC generator 246 performs a CRC operation. More specifically, CRC generator 246 generates an EDC code, such as a CRC value, and transmits the EDC code to EDC encoder 248. At step 616, an EDC encoder 248 included in the memory device performs an encoding operation on the EDC code to generate outgoing EDC code. EDC code transmitted by the memory device to the memory controller via the EDC I/O pins 226 is typically encoded to optimize the signal transmission over the memory interface, as described herein. EDC encoder 248 transmits the encoded EDC code to a transmitter 252 included in the memory device.

At step 618, transmitter 252 transmits the encoded EDC code to the memory controller. Transmitter 252 serializes the EDC code and transmits the EDC code to the memory controller via EDC I/O pins 226. The memory controller, deserializes the EDC code received via the EDC I/O pins 226. The memory controller generates a second EDC code, such as a CRC value, based on the encoded read data received via the DQ, DQX I/O pins 202. The memory controller compares the second EDC code with the EDC code received from EDC encoder 248 and generates a status output. If the second EDC code matches the EDC code received from EDC encoder 248, then the memory controller generates a pass status output. If the second EDC code does not match the EDC code received from EDC encoder 248, then the memory controller generates a fail status output.

During a read operation, multiplexor 236 selects the output of read clock (RCK) generator 238 and transmits the output of RCK generator 238 to transmitter 240. Transmitter 240 transmits the output of RCK generator 238 to the memory controller via RCK output pin 242, thereby providing a read clock signal by which the memory controller samples the read data received via DQ, DQX I/O pins 202 and the EDC code received via EDC I/O pins 226. The method 600 then terminates.

In sum, various embodiments are directed to techniques for data scrambling on an interface of a DRAM memory device. The disclosed techniques provide synchronized scrambling and descrambling of data on a memory interface to ensure that a pathological data pattern is not repeated on the interface. A memory controller coupled with a memory device generates a predictable series of sequence values. The disclosed memory device stores the same predictable series of sequence values, as received from the memory controller.

During a write operation, the memory controller scrambles the write data according to a first sequence value. The memory controller further transmits the first sequence value to the memory device, and the memory device stores the first sequence value in a memory location, such as a configuration register. When the memory device receives the scrambled write data, the memory device descrambles the write data according to the same first sequence value as stored in the memory location. If the write operation fails, the memory controller repeats the write operation with the same write data. The memory controller scrambles the write data according to a second sequence value, resulting in a different pattern on the memory interface. The memory controller further transmits the first sequence value to the memory device, and the memory device stores the first sequence value in a memory location, such as a configuration register. When the memory device receives the scrambled write data, the memory device descrambles the write data according to the same second sequence value as stored in the memory location.

The memory controller transmits a third sequence value to the memory device, and the memory device stores the third sequence value in a memory location, such as a configuration register. During a read operation, the memory device scrambles the read data according to the third sequence value. When the memory controller receives the scrambled read data, the memory controller descrambles the read data according to the same third sequence value. If the read operation fails, the memory controller transmits a fourth sequence value to the memory device, and the memory device stores the fourth sequence value in a memory location, such as a configuration register. The memory controller repeats the read operation, and the memory device retrieves the same read data. The memory device scrambles the read data according to a fourth sequence value, resulting in a different pattern on the memory interface. When the memory controller receives the scrambled read data, the memory controller descrambles the read data according to the same fourth sequence value.

At least one technical advantage of the disclosed techniques relative to the prior art is that, with the disclosed techniques, the DRAM memory device, in concert with the memory controller, changes the scrambling pattern for the write data or read data during replay operations. As a result, the scrambled data transferred over the memory interface changes between the original operation and the associated replay operation. Similarly, the scrambled data transferred over the memory interface changes between a first replay operation and a subsequent second replay operation for the same original operation. Consequently, the likelihood that an error resulting from data dependent jitter for one operation will be repeated during a subsequent replay operation is reduced relative to prior techniques. Another technical advantage relative to the prior art is that the disclosed techniques enable data scrambling of a memory interface without the need to include a LFSR, PRNG, or other circuit within the DRAM memory device in order to generate sequence values. These advantages represent one or more technological improvements over prior art approaches.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for processing scrambled data in a memory device, the method comprising:
   receiving a triggering event associated with a first read operation or a first write operation previously directed to the memory device;
   synchronizing, responsive to the triggering event, a first set of data scrambling operations associated with the memory device with a second set of data scrambling operations associated with a memory controller;
   receiving first scrambled data for a second write operation based on first original data for the second write operation and on a first value generated by the second set of data scrambling operations;
   receiving second scrambled data for a third write operation based on the first original data for the second write operation and on a second value generated by the second set of data scrambling operations, wherein the third write operation comprises a replay operation of the second write operation, and wherein the second scrambled data is different from the first scrambled data;
   descrambling the second scrambled data based on a third value generated by the first set of data scrambling operations to generate descrambled data; and
   storing the descrambled data in a memory core of the memory device.

2. The computer-implemented method of claim 1, further comprising, prior to descrambling the second scrambled data, modifying the second scrambled data by performing a decoding operation on the second scrambled data.

3. The computer-implemented method of claim 2, wherein the decoding operation comprises at least one of a maximum transition avoidance (MTA) operation, a data bus inversion (DBI) operation, or a pulse-amplitude modulation version 3 (PAM3) operation.

4. The computer-implemented method of claim 1, further comprising:
   performing a cyclic redundancy check (CRC) operation on the first scrambled data; and
   transmitting an error result based associated with the CRC operation.

5. The computer-implemented method of claim 1, further comprising:
   loading the descrambled data from the memory core;
   scrambling the descrambled data based on a fourth value generated by a third set of data scrambling operations to generate third scrambled data; and
   transmitting the third scrambled data to the memory controller.

6. The computer-implemented method of claim 5, further comprising, prior to transmitting the third scrambled data, modifying the third scrambled data by performing an encoding operation on the third scrambled data.

7. The computer-implemented method of claim 6, wherein the encoding operation comprises at least one of a maximum transition avoidance (MTA) operation, a data bus inversion (DBI) operation, or a pulse-amplitude modulation version 3 (PAM3) operation.

8. The computer-implemented method of claim 5, further comprising:
   performing a cyclic redundancy check (CRC) operation on the third scrambled data to generate a CRC value; and
   transmitting the CRC value to the memory controller.

9. The computer-implemented method of claim 5, wherein the first set of data scrambling operations is the same as the third set of data scrambling operations.

10. The computer-implemented method of claim 5, wherein the first set of data scrambling operations is different from the third set of data scrambling operations.

11. The computer-implemented method of claim 5, wherein at least one of the first set of data scrambling operations or the third set of data scrambling operations is based on a pseudorandom bit sequence, an inversion operation, a shift operation, or a swap operation.

12. The computer-implemented method of claim 5, wherein at least one of the first set of data scrambling operations or the third set of data scrambling operations is based on a logical operation comprising one or more of an exclusive or (XOR) operation, an exclusive not-or (XNOR) operation, an and (AND) operation, a not-and (NAND) operation, an or (OR) operation, or a not-or (NOR) operation.

13. The computer-implemented method of claim 1, wherein the first set of data scrambling operations associated with the memory device comprises transmitting a first sequence value stored in a configuration register to at least one of a scrambler unit or a descrambler unit.

14. The computer-implemented method of claim 13, wherein the second set of data scrambling operations associated with the memory controller comprises generating, by a sequence generator, a second sequence value, wherein the first sequence value is equal to the second sequence value.

15. The method of claim 1, wherein the triggering event is generated responsive to a failure associated with the first read operation or the first write operation.

16. The method of claim 1, wherein the triggering event is generated responsive to a transmission associated with the first read operation or the first write operation.

17. A system, comprising:
   a memory controller; and
   a memory device coupled to the memory controller, and that:
      receives a triggering event associated with a first read operation or a first write operation previously directed to the memory device;
      synchronizes, responsive to the triggering event, a first set of data scrambling operations associated with the memory device with a second set of data scrambling operations associated with the memory controller;
      receives first scrambled data for a second write operation based on first original data for the second write operation and on a first value generated by the second set of data scrambling operations;
      receives second scrambled data for a third write operation based on the first original data for the second write operation and on a second value generated by the second set of data scrambling operations, wherein the third write operation comprises a replay operation of the second write operation, and wherein the second scrambled data is different from the first scrambled data;

descrambles the second scrambled data based on a third value generated by the first set of data scrambling operations to generate descrambled data; and stores the descrambled data in a memory core of the memory device.

18. The system of claim 17, further comprising, prior to descrambling the second scrambled data, modifying the second scrambled data by performing a decoding operation on the second scrambled data.

19. The system of claim 18, wherein the decoding operation comprises at least one of a maximum transition avoidance (MTA) operation, a data bus inversion (DBI) operation, or a pulse-amplitude modulation version 3 (PAM3) operation.

20. The system of claim 17, further comprising:

performing a cyclic redundancy check (CRC) operation on the first scrambled data; and transmitting an error result based associated with the CRC operation.

21. The system of claim 17, further comprising:

loading the descrambled data from the memory core;

scrambling the descrambled data based on a fourth value generated by a third set of data scrambling operations to generate third scrambled data; and transmitting the third scrambled data to the memory controller.

22. The system of claim 21, further comprising, prior to transmitting the third scrambled data, modifying the third scrambled data by performing an encoding operation on the third scrambled data.

* * * * *